US009048840B2

(12) United States Patent
Liu et al.

(10) Patent No.: US 9,048,840 B2
(45) Date of Patent: Jun. 2, 2015

(54) 20V TO 250V HIGH CURRENT ASIC PIN DIODE DRIVER

(75) Inventors: Chengxin Liu, Bedford, MA (US); Christopher D. Weigand, Andover, MA (US); Richard J. Giacchino, Burlington, MA (US); Scott Vasquez, Boston, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 620 days.

(21) Appl. No.: 13/330,858

(22) Filed: Dec. 20, 2011

(65) Prior Publication Data
US 2013/0049818 A1 Feb. 28, 2013

Related U.S. Application Data

(60) Provisional application No. 61/525,982, filed on Aug. 22, 2011.

(51) Int. Cl.
*H03K 3/00* (2006.01)
*H03K 17/74* (2006.01)
*H03K 17/76* (2006.01)
*H03K 3/356* (2006.01)

(52) U.S. Cl.
CPC .......... *H03K 17/74* (2013.01); *H03K 3/356182* (2013.01); *H03K 17/76* (2013.01)

(58) Field of Classification Search
None
See application file for complete search history.

(56) References Cited

U.S. PATENT DOCUMENTS

| 3,546,484 | A * | 12/1970 | Fowler et al. | 326/90 |
| 7,710,152 | B1 * | 5/2010 | El Bacha et al. | 326/81 |
| 2006/0255835 | A1 * | 11/2006 | Cordoba | 326/68 |
| 2007/0216443 | A1 * | 9/2007 | Ryan | 326/81 |
| 2011/0187431 | A1 * | 8/2011 | Bhattacharya et al. | 327/210 |
| 2012/0176177 | A1 * | 7/2012 | Phillips | 327/399 |
| 2012/0212256 | A1 * | 8/2012 | Nicholas et al. | 326/80 |
| 2013/0049818 | A1 * | 2/2013 | Liu et al. | 327/109 |

OTHER PUBLICATIONS

"Data Sheet for HV3922 High Voltage PIN Diode Driver", HV3922. pdf,, Supertex inc., pp. 1-9, 2009.
"Data Sheet for MADR-008851-000100 PIN Diode Driver for Series / Shunt High Power Switches", Rev. 1, MADR-008851-000100.pdf, MA-COM Technology Solutions, pp. 1-6, 2009.

* cited by examiner

*Primary Examiner* — Lincoln Donovan
*Assistant Examiner* — Khareem E Almo
(74) *Attorney, Agent, or Firm* — Christopher P. Maiorana, PC

(57) ABSTRACT

An integrated circuit including a first circuit, a second circuit, a third circuit, a first complementary pair of transistors, and a second complementary pair of transistors. The first circuit may be configured to generate a first input signal in response to a first control input signal. The second circuit may be configured to generate a first output signal and a second output signal in response to the first input signal and a bias signal. The third circuit may be configured to generate the bias signal in response to a bias input signal. The first complementary pair of transistors may be configured to drive a first series output of the integrated circuit in response to the first output signal. The second complementary pair of transistors may be configured to drive a first shunt output of the integrated circuit in response to the second output signal.

21 Claims, 9 Drawing Sheets

20V TO 250V HIGH CURRENT ASIC PIN DIODE DRIVER

This application claims the benefit of U.S. Provisional Application No. 61/525,982, filed Aug. 22, 2011, and is hereby incorporated by reference in its entirety.

FIELD OF THE INVENTION

The present invention relates to current drivers generally and, more particularly, to a method and/or apparatus for implementing a 20V to 250V high current application specific integrated circuit (ASIC) PIN diode driver.

BACKGROUND OF THE INVENTION

P Intrinsic N (PIN) diodes are used commonly in an assortment of commercial and military applications as switches, phase shifters, and attenuators. Currently, no fully integrated high voltage PIN diode driver exists. Instead, conventional systems use discrete power MOSFETs (metal-oxide-semiconductor field effect transistors) to achieve the bias current requirement for the high power PIN diodes. The discrete power MOSFETs limit a gate to source voltage to no higher than 20V to 25V. The gate to source voltage limitation requires the addition of a discrete voltage translator to control the high side power MOSFETs. The discrete voltage translation is usually done by resistor dividers and is very slow unless more quiescent power is dissipated. Commercially available full-bridge or half-bridge gate driver ICs cannot be used because bootstrap capacitors are required to form a charge pump to fully shut down the high side MOSFETs. The use of such a charge pump is not acceptable for PIN drivers because the charge in the bootstrap capacitor discharges over time, preventing the PIN diodes from being in the OFF state for a sustained period of time.

It would be desirable to have a high current integrated circuit PIN diode driver that will withstand the higher voltage levels required by the high-energy signal systems found today.

SUMMARY OF THE INVENTION

The present invention concerns an integrated circuit including a first circuit, a second circuit, a third circuit, a first complementary pair of transistors, and a second complementary pair of transistors. The first circuit may be configured to generate a first input signal in response to a first control input signal. The second circuit may be configured to generate a first output signal and a second output signal in response to the first input signal and a bias signal. The third circuit may be configured to generate the bias signal in response to a bias input signal. The first complementary pair of transistors may be configured to drive a first series output of the integrated circuit in response to the first output signal. The second complementary pair of transistors may be configured to drive a first shunt output of the integrated circuit in response to the second output signal.

The objects, features and advantages of the present invention include providing a method and/or apparatus for implementing a high voltage, high current application specific integrated circuit (ASIC) PIN diode driver that may (i) be fully integrated, (ii) achieve a desired current capability without external power MOSFETs, (iii) provide 200 mA current to two independent series diodes and 50 mA current to two independent shunt diodes, (iv) drive a typical series/shunt, series/shunt SPDT PIN diode switch, (v) be extended to drive switches of any number of poles and throws, (vi) be extended to drive absorptive, as well as reflective switches, (vii) be extended to higher voltages as higher voltage processes become available, (viii) include a fully integrated voltage translator that uses regular logic control, (ix) be compatible to both 3V and 5V logic, (x) allow a ultra wide back bias voltage range (e.g., from 20 volts to 250 volts), (xi) have super low quiescent power consumption (e.g., as low as 10 μA for 250 volt operation), (xii) provide fast switching speed (e.g., less than 8 μs), and/or (xiii) provide a pad spacing on a PQFN package that prevents voltage breakdown between the pads at the maximum operating voltage of the driver.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides a fully integrated solution to drive high power PIN diodes. The fully integrated solution may be utilized in applications that involve both high sinking current capability and high voltage back biasing to provide enough isolation. For example, a fully integrated PIN diode driver circuit implemented in accordance with an embodiment of the present invention may be utilized in commercial and/or military radio frequency (RF) applications (e.g., communications, etc.).

Figure 1:
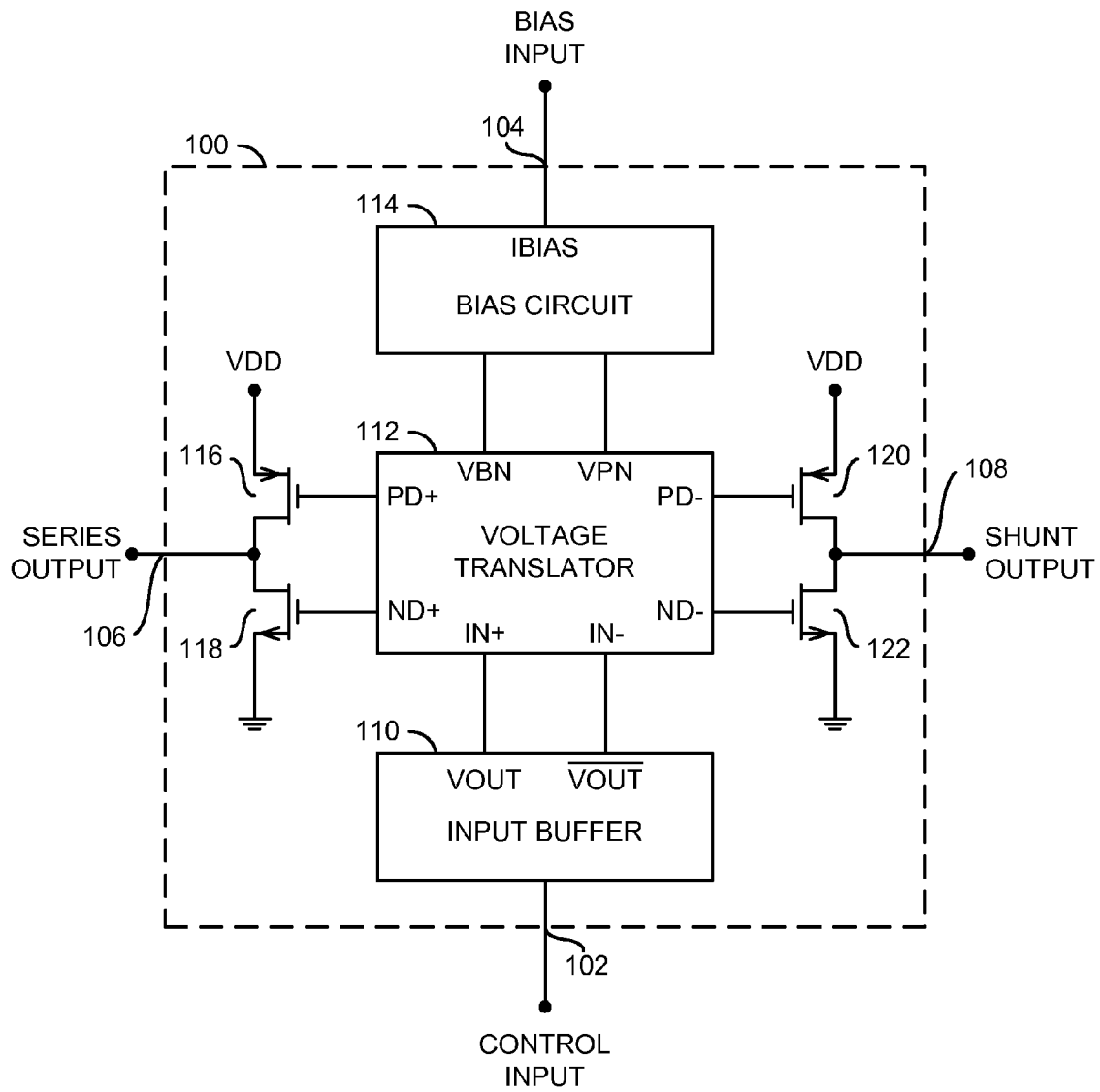
FIG. 1 is a block diagram illustrating an application specific integrated circuit (ASIC) PIN diode driver circuit in accordance with an example embodiment of the present invention.

Referring to FIG. 1, a block diagram of a circuit 100 is shown illustrating a high current application specific integrated circuit (ASIC) PIN diode driver in accordance with a example embodiment of the present invention. In one example, the circuit 100 may have an input 102 that may receive a signal (e.g., CONTROL INPUT), an input 104 that may receive a signal (e.g., BIAS INPUT), a first output 106 that may present a signal (e.g., SERIES OUTPUT) and an output 108 that may present a signal (e.g., SHUNT OUTPUT). The signal CONTROL INPUT may be implemented as a control signal. In one example, the signal CONTROL INPUT may comprise a single-ended 3V or 5V logic control signal. The signal BIAS INPUT may be implemented as a bias input signal. In one example, the signal BIAS INPUT may be implemented as a current signal (e.g., IBIAS). Alternatively, the signal BIAS INPUT may be implemented as a voltage level (e.g., VBIAS). The signals SERIES OUTPUT and SHUNT OUTPUT may be used to control PIN diodes.

In one example the circuit 100 may comprise a block (or circuit) 110, a block (or circuit) 112, and a block (or circuit) 114. The circuit 100 may also comprise a number of fully integrated metal-oxide-semiconductor field effect transistors (MOSFETs) 116, 118, 120, 122. The MOSFETs 116 and 120 may be implemented as PFETs. The MOSFETs 118 and 122 may be implemented as NFETs. The MOSFETs 116 and 118 may form a first complementary pair. The MOSFETs 120 and 122 may form a second complementary pair. The circuit 110 may implement an input buffer. The circuit 112 may implement a voltage translator. The circuit 114 may implement a bias network. The circuit 110 may be configured to condition (e.g., square up, etc.) the signal CONTROL INPUT and generate a signal (e.g., VOUT). In one example, the signal VOUT may be implemented as a pair of complementary control signals (e.g., VOUT and /VOUT). The pair of complementary control signals VOUT and /VOUT may be presented as a complementary input signal (e.g., IN+ and IN−) to a first input of the circuit 112.

The circuit 112 may have a second input that may receive a pair of bias signals (e.g., VBN and VBP). The bias signals VBN and VBP may be implemented as bias voltage levels. The signals VBN and VBP may provide gate bias voltages that may be used in protecting portions of the circuit 112. The circuit 112 may also have a first pair of outputs that may present a first pair of complementary control signals (e.g., PD+ and PD−) and a second pair of outputs that may present a second pair of complementary control signals (e.g., ND+ and ND−). The complementary control signals PD+ and PD− may be configured to drive the gates of the fully integrated power PFETs 116 and 120. The complementary control signals ND+ and ND− may be configured to drive the gates of the fully integrated power NFETs 118 and 122. The fully integrated complementary pair of power MOSFETs 116 and 118 may be configured to present the series output control signal SERIES OUTPUT to the output 106. The fully integrated complementary pair of power MOSFETs 120 and 122 may be configured to present the shunt output control signal SHUNT OUTPUT to the output 108.

The circuit 114 may have an input that may receive the signal BIAS INPUT and an output that may present the complementary bias voltage signals VBN and VBP. One or more instances of the circuit 100 may be implemented on a single integrated circuit substrate. In one example, two independent driver circuits 100 may be instantiated on a single die. The two driver circuits 100 may be identical, but share a single instance of the bias circuit 114.

The integrated power MOSFETs 116, 118, 120, 122 may be implemented, in one example, as 275V rated power MOSFETs. The use of 275V rated power MOSFETs allows the series output 106 and the shunt output 108 to be switched safely between 250V and ground. The power MOSFETs 118 and 122 may be sized such that the MOSFET 118 is able to sink a 200 mA current and the MOSFET 122 is able to sink a 50 mA current when a 3V power supply is used to bias the PIN diodes. In one example, the gate to source voltage (e.g., Vgs) limit for the power MOSFETs 116 and 120 may be a first voltage (e.g., 15V), while the gate to source voltage limit for the power MOSFETs 118 and 122 may be a second, higher voltage (e.g., 20V).

Figure 2:
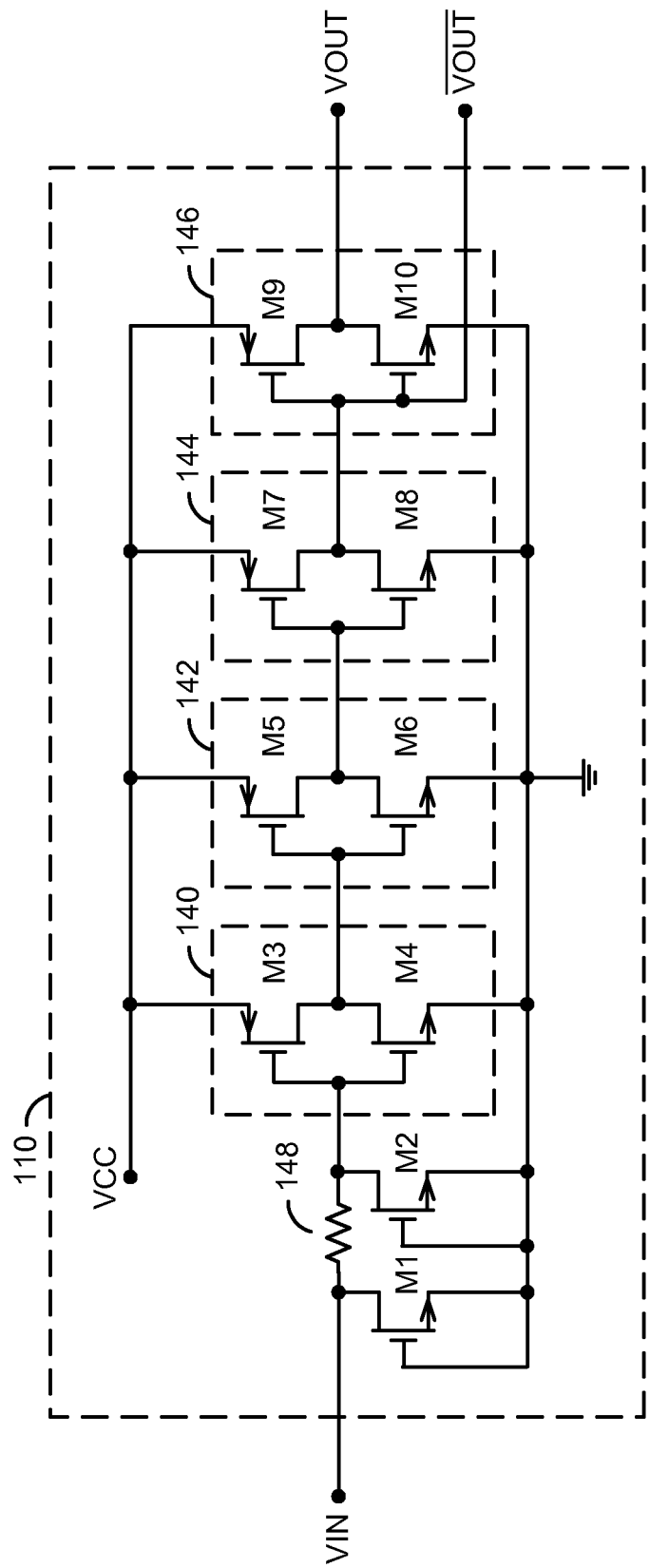
FIG. 2 is a block diagram illustrating an example implementation of an input buffer circuit of FIG. 1.

Referring to FIG. 2, a block diagram is shown illustrating an example implementation of the circuit 110 of FIG. 1. In one example, the circuit 110 may comprise a number of MOSFETs M1 to M10. The MOSFETS M1 and M2 may have respective gates and sources connected such that the MOSFETS M1 and M2 function as diodes. The MOSFETs M3 and M4 may be connected to form a complementary metal oxide semiconductor (CMOS) inverter 140. The MOSFETs M5 and M6 may be connected to form a CMOS inverter 142. The MOSFETs M7 and M8 may be connected to form a CMOS inverter 144. The MOSFETs M9 and M10 may be connected to form a CMOS inverter 146. The CMOS inverters 140, 142, 144 and 146 may be connected between a supply voltage VCC and a ground potential. An input signal VIN may be presented to a drain of the MOSFET M1 and a first terminal of a resistor 148. A second terminal of the resistor 148 may be connected to a drain of the MOSFET M2 and an input of the CMOS inverter 140. An output of the inverter 140 may be connected to an input of the inverter 142. An output of the inverter 142 may be presented to an input of the inverter 144. An output of the inverter 144 may be presented to an input of the inverter 146. An output of the inverter 146 may present the signal VOUT. An output of the inverter 144 may present the complementary signal /VOUT.

Figure 3:
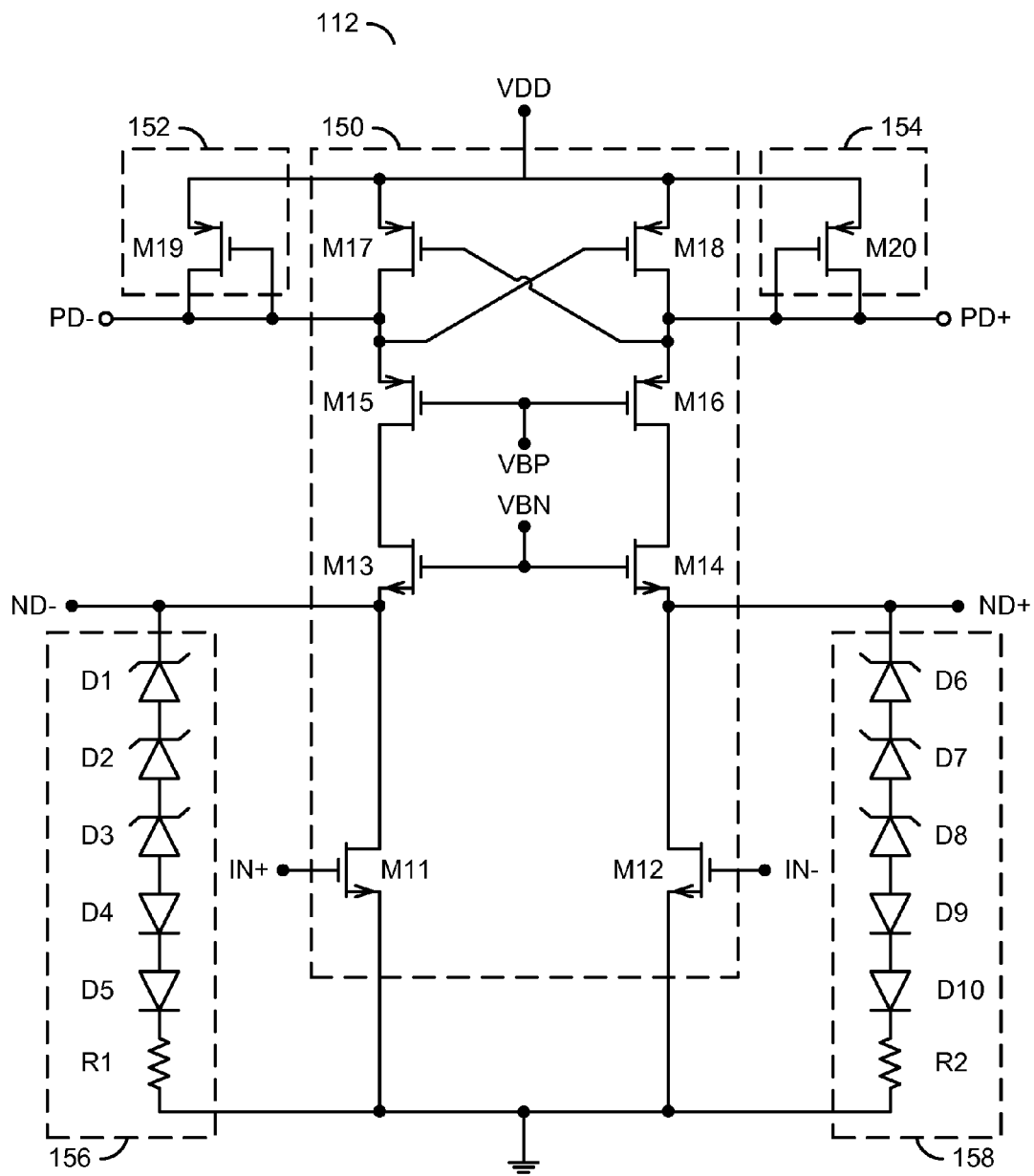
FIG. 3 is a block diagram illustrating an example implementation of a voltage translator circuit of FIG. 1.

Referring to FIG. 3, a block diagram is shown illustrating an example implementation of the circuit 112 of FIG. 1. In one example, the circuit 112 may comprise a block (or circuit) 150, a block (or circuit) 152, a block (or circuit) 154, a block (or circuit) 156, and a block (or circuit) 158. The circuit 150 may implement a voltage translator circuit. The circuits 152, 154, 156, and 158 may implement protection circuitry. In one example, the circuit 150 may comprise a plurality of fully integrated MOSFETs M11 through M18. The MOSFETs M11 and M12 may be implemented, in one example, as 20V FETs. The MOSFETs M13 through M16 may be implemented, in one example, as 275V FETs. The MOSFETs M17 and M18 may be implemented, in one example, as 15V FETs. A source of the MOSFET M11 and a source of the MOSFET M12 may be connected to the power supply ground potential. A gate of the MOSFET M11 may receive the signal IN+. A gate of the MOSFET M12 may receive the signal IN−. A drain of the MOSFET M11 may be connected to a source of the MOSFET M13. A drain of the MOSFET M12 may be connected to a source of the MOSFET M14.

A gate of the MOSFET M13 and a gate of the MOSFET M14 may be connected together and received the signal VBN. A drain of the MOSFET M13 may be connected to a drain of the MOSFET M15. A drain of the MOSFET M14 may be connected to a drain of the MOSFET M16. A gate of the MOSFET M15 and a gate of the MOSFET M16 may be connected together and received the signal VBP. A source of the MOSFET M15 may be connected to a drain of the MOSFET M17 and a gate of the MOSFET M18. A source of the MOSFET M16 may connect to a drain of the MOSFET M18 and a gate of the MOSFET M17. The signal VBN generally provides the gate bias for the MOSFETs M13 and M14 to protect the MOSFETs M11 and M12. The signal VBP generally provides the gate bias for the MOSFETs M15 and M16 to protect the MOSFETs M17 and M18.

A source of the MOSFET M17 and a source of the MOSFET M5 may be connected to a supply voltage VDD. The output signal PD+ may be presented at a node formed by the source of the MOSFET M16, the gate of the MOSFET M17 and the drain of the MOSFET M18. The output signal ND+ may be presented at a node formed by the connection of the drain of the MOSFET M12 and the source of the MOSFET M14. The output signal PD− may be presented at a node formed by the source of the MOSFET M15, the drain of the MOSFET M17 and the gate of the MOSFET M18. The output signal ND− may be presented at a node formed by the drain of the MOSFET M11 and the source of the MOSFET M13. The bias voltage VBP may be configured to be within 15V of the supply voltage VDD to protect the MOSFETs M17 and M18. The bias voltage VBN may be configured to be within 20V of the ground potential to protect the MOSFETs M11 an M12.

In order for the circuit 100 to remain in a particular state for a long time, protection circuitry may be added to the voltage translator 112. The protection circuitry may comprise the blocks 152, 154, 156, and 158. Without the protection circuitry, the sources of the MOSFETs M13 and M14 could be pulled to VDD by leakage current through the MOSFETs M15 and M16. This could damage the MOSFETs M11 and M12 when implemented, for example, as 20V FETs. The same is true for the MOSFETs M17 and M18. The drain of the MOSFETs M17 and M18 could be pulled down to the ground potential, which could exceed the operational limit.

To protect the MOSFETs M17 and M18, the blocks 152 and 154 may be connected between the source and the drain of the MOSFETs M17 and M18, respectively. In one example, the block 152 may comprise one or more serially stacked diode connected MOSFETs (illustrated as the MOSFET M19) and the block 154 may comprise one or more serially stacked diode connected MOSFETs (illustrated by the MOSFET M20). The diode connected MOSFETs M19 and M20 generally provide the charge needed to compensate for the leakage discharge. The on resistances of the MOSFETs M19 and M20 are generally set to a large value (e.g., 2.5 MΩ) to limit unwanted leakage current from VDD.

Each of the blocks 156 and 158 may comprise, in one example, a chain of three Zener diodes (e.g., D1, D2, D3 and D6, D7, D8, respectively), two regular diodes (e.g., D4 and D5, respectively), and a resistor (e.g., R1 and R2, respectively). The blocks 156 and 158 may be used to protect the MOSFETs M11 and M12, respectively. Since the signal VBN has a voltage level that is three times a Zener diode voltage (described below in connection with FIG. 4), the protection circuitry is not generally turned on unless the source of the MOSFETs M13 or M14 is pulled up by leakage current to one diode drop above the voltage level of the signal VBN. For normal operation, the blocks 156 and 158 are generally shut down and do not consume any power. From measurement results, the total quiescent current consumed by the block 112 other than by the bias network 114 is less than 2 μA from VDD.

Figure 4:
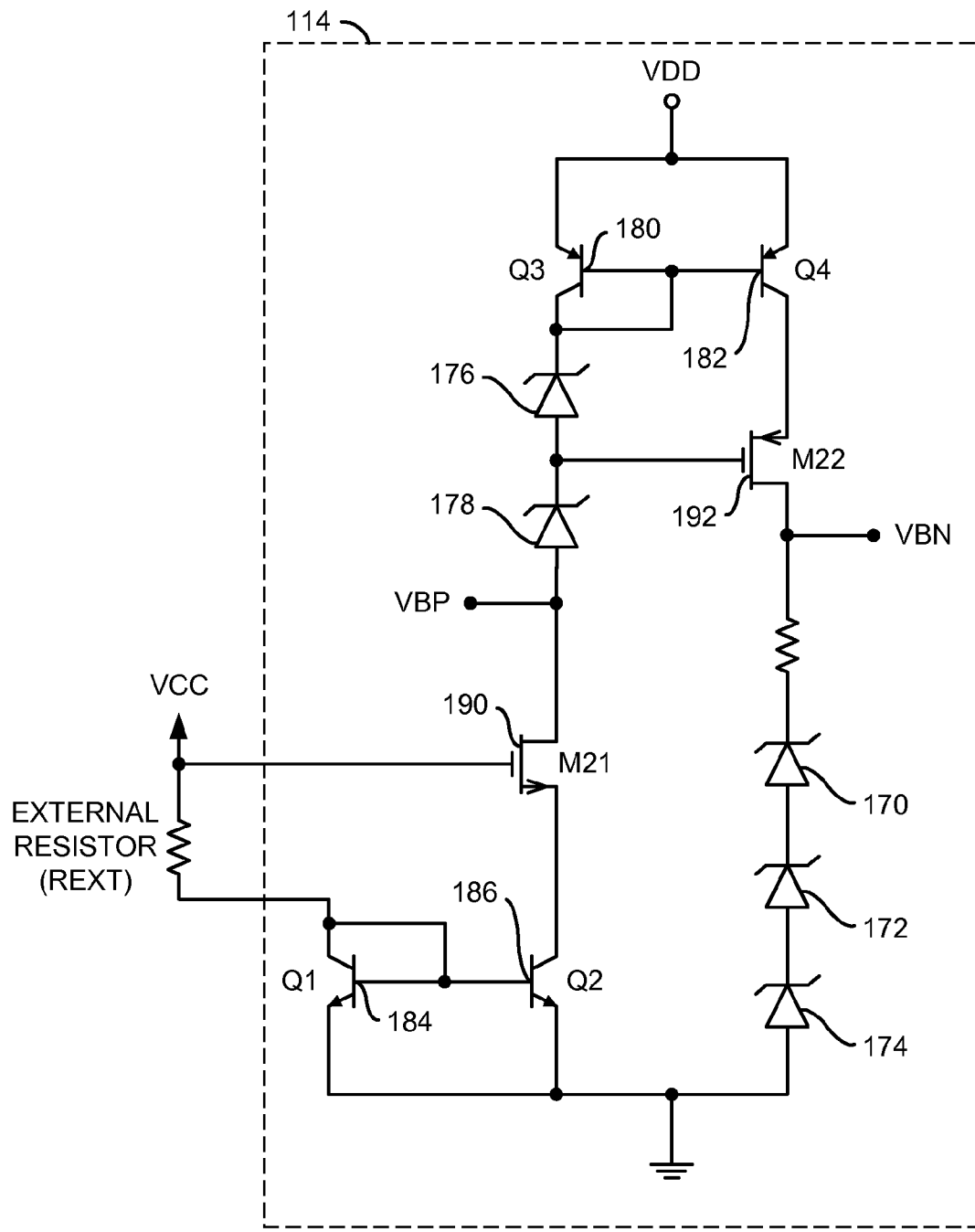
FIG. 4 is a block diagram illustrating an example implementation of a bias circuit of FIG. 1.

Referring to FIG. 4, a block diagram is shown illustrating an example implementation of the bias circuit 114 of FIG. 1. The circuit 114 generally implements a bias network in accordance with an embodiment of the present invention. The circuit 114 generally achieves a wide supply voltage VDD operating range. In conventional bias circuits, the bias voltages VBN and VBP are generated using resistor/diode connected FET networks. The conventional configuration limits the operating range and also affects the gate drive capability. The circuit 114 generally utilizes Zener diodes as voltage references. A first bias voltage (e.g., VBN) may be generated from three Zener diodes 170, 172, 174. The Zener diodes 170, 172, 174 are generally implemented with a Zener voltage of about 4.8V. A second bias voltage (e.g., VBP) may be generated from two Zener diodes 176, 178 and a PNP bipolar junction transistor 180. The PNP bipolar junction transistor 180 is connected as a diode. The first and the second bias voltages VBN and VBP are generally referenced to a supply voltage (e.g., VDD or ground).

The circuit 114 may further comprise bipolar junction transistors 182, 184 and 186, and power MOSFETs 190 and 192. The power MOSFETs 190 and 192 may be implemented, in one example, as 275V FETs to protect the 5V Zener diodes 170-178 and the bipolar transistors 180, 182, 184, and 186. The bipolar transistors 180,182 and the bipolar transistors 184,186 may be configured as current mirrors to bias the Zener diodes. The advantage of using current mirrors is that the current consumption is independent of the supply voltage VDD. Instead, the power consumption may be determined by the current through an external resister (e.g., REXT). This allows super low quiescent current consumption (e.g., 8 μA) no matter where the supply voltage VDD is set within the range between 20V to 250V. Since the resistor REXT is external to the ASIC containing the circuit 100, the customer gets the flexibility of trading power dissipation vs. switching speed; the voltage translator switches faster with higher power dissipation.

Figure 5:
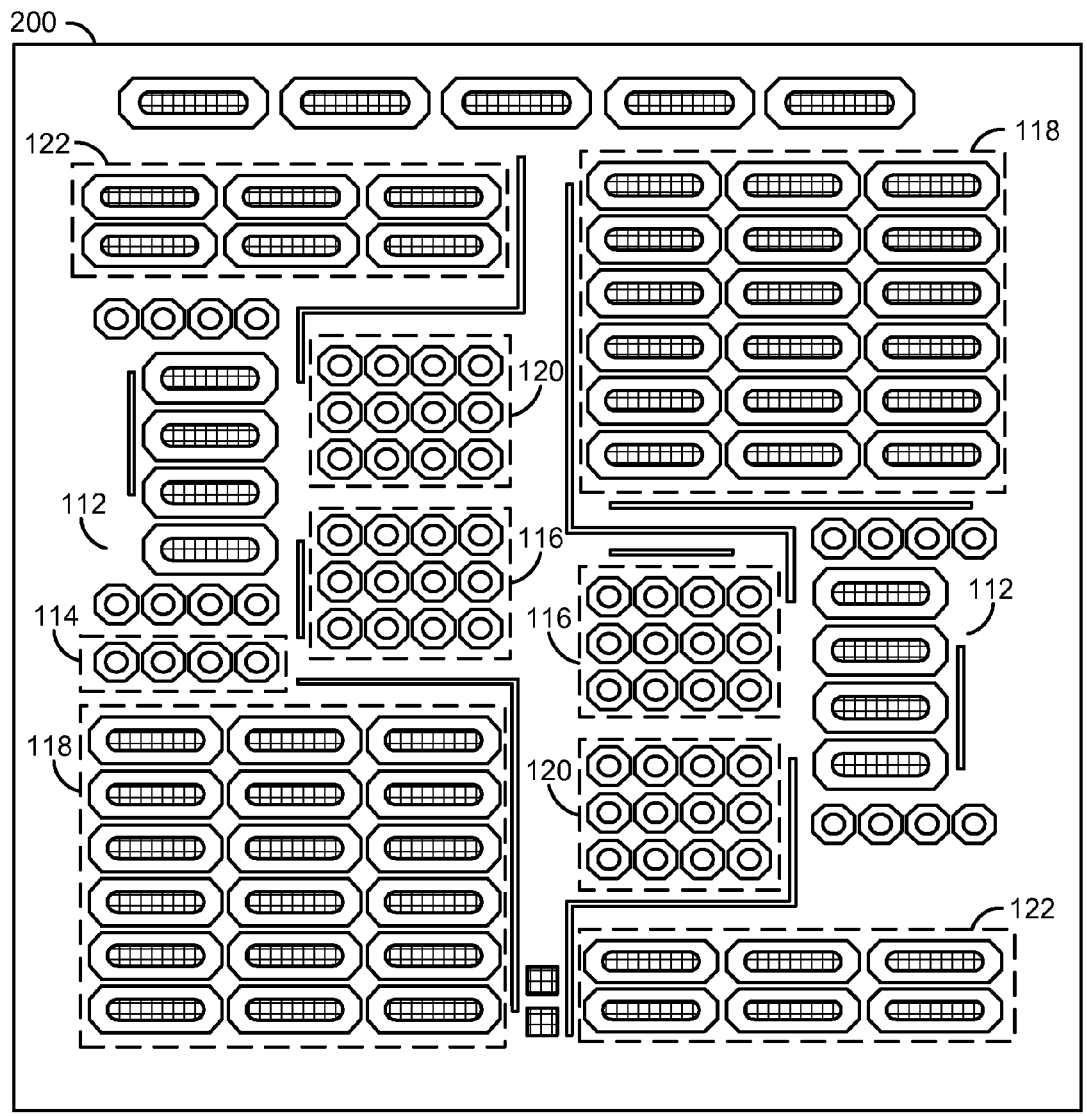
FIG. 5 is a diagram illustrating a die layout having two independent ASIC PIN diode driver circuits implemented in accordance with an example embodiment of the present invention.

Referring to FIG. 5, a diagram of a die layout 200 is shown illustrating an application specific integrated circuit including two independent high current PIN diode drivers in accordance with an embodiment of the present invention. In one example, two independent driver circuits 100 (described above in connection with FIG. 1) may be instantiated on a single die. The two driver circuits may be identical but share a single instance of the bias circuit 114. Individual structures of the die layout are labeled with the number of the corresponding element in FIG. 1.

Figure 6:
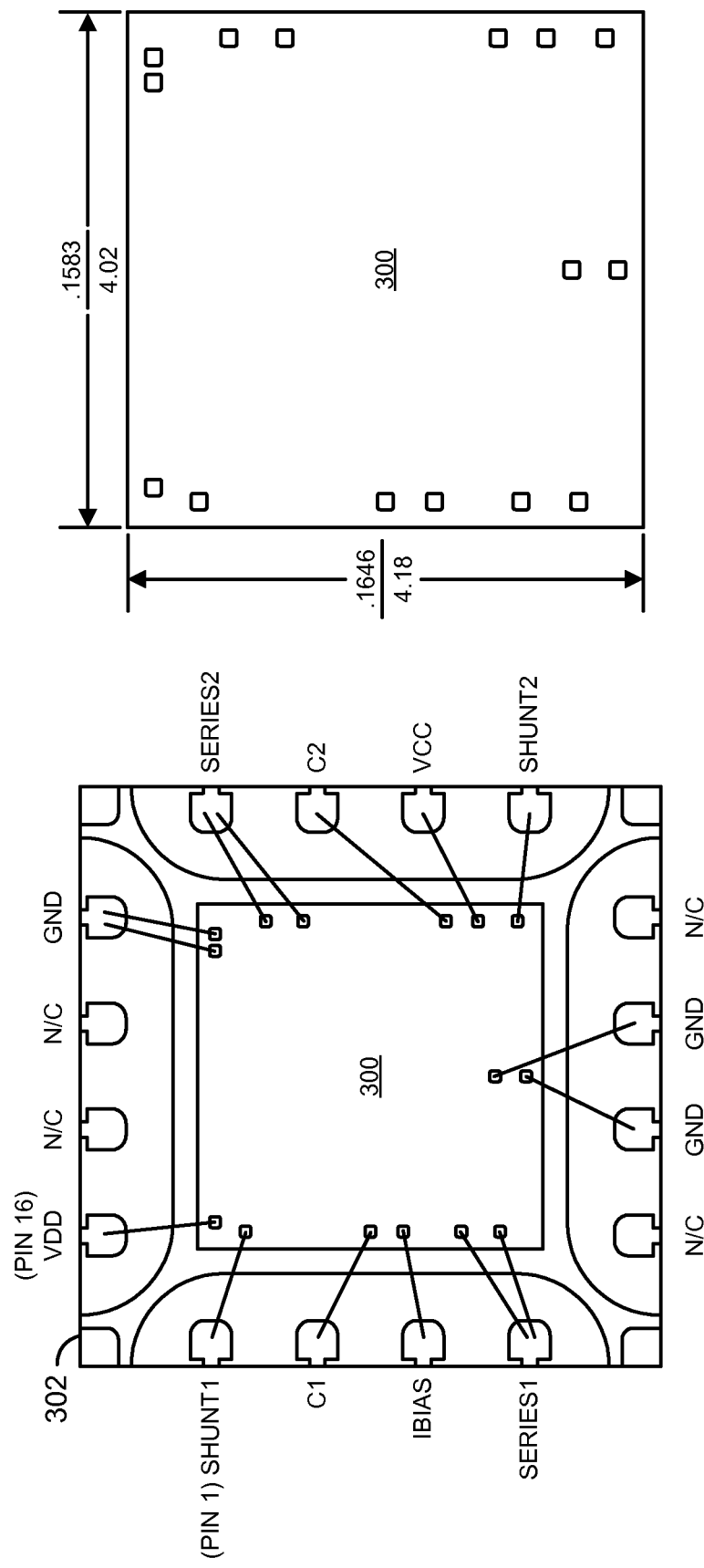
FIG. 6 is a diagram illustrating a pad layout and wire bonding connections.

Referring to FIG. 6, a diagram is shown illustrating a die 300 containing a pair of circuits 100 and an etched (or copper) lead frame 302. The die 300 may be attached to the lead frame 302 with epoxy. The die 300 may be wire bonded to the lead frame 302. A package design for the die and lead frame generally includes a lead to lead spacing of 0.87 mm and a lead to exposed pad spacing of 0.825 mm. The pad to pad, pad to wire bond, and wire bond to wire bond spacing is generally set to a sufficient value (e.g., 300 μm) for high voltage (e.g., 250V) operation.

Figure 7:
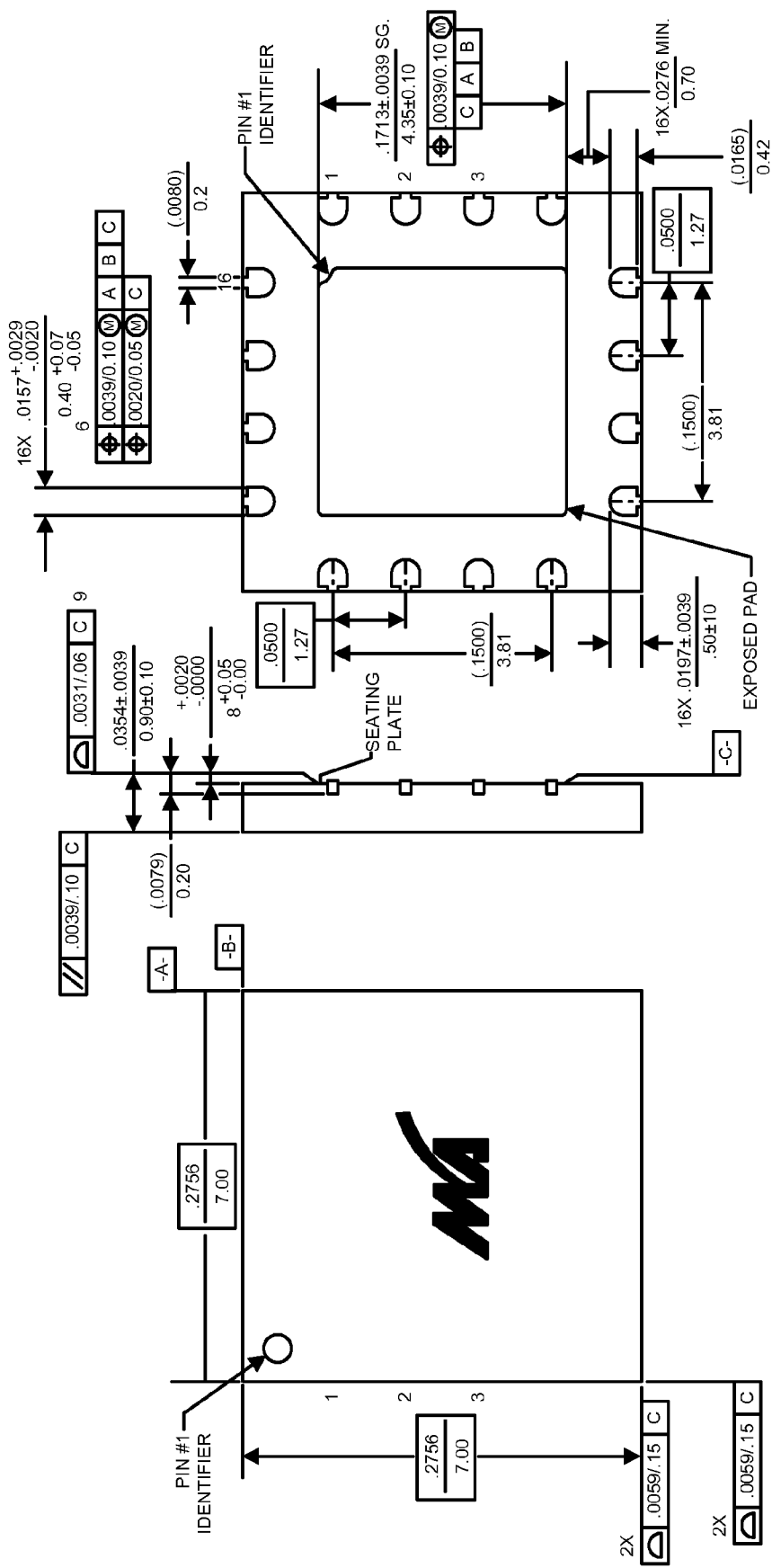
FIG. 7 is a diagram illustrating an example package outline.

Referring to FIG. 7, a diagram is shown illustrating an example package outline for an ASIC PIN diode driver chip in accordance with the present invention. In one example, a 7 mm-16 LD PQFN package having a 0.9 mm package thickness may be used. The die may be mounted to a half-etched NiPdAuAg pre-plated Cu lead frame. The exposed pads may be 4.35 mm square. 0.5×0.4 mm exposed leads may be used. A pin #1 orientation feature may appear on both top and bottom surfaces of the package.

Figure 8:
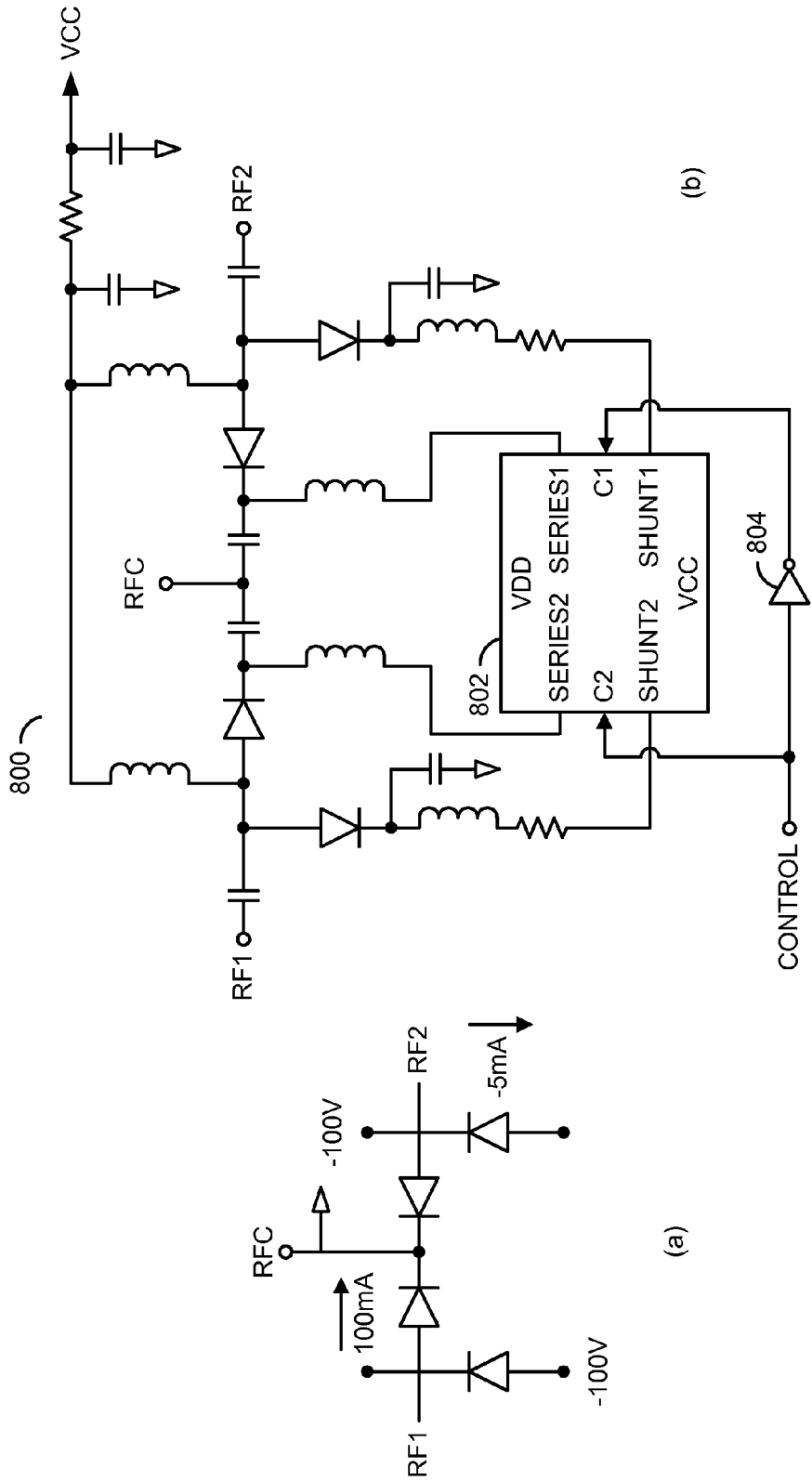
FIG. 8 is a diagram illustrating an example application of an ASIC PIN diode driver in accordance with the present invention.

Referring to FIG. 8, a diagram is shown illustrating (a) a diode topology of a conventional PIN diode single-pole, double-throw (SPDT) switch and (b) an example SPDT switching application using an ASIC PIN diode driver chip implemented in accordance with an embodiment of the present invention. An expanded circuit 800 is shown generally illustrating an ASIC PIN diode driver chip 802 along with biasing, DC blocking capacitors, bypass capacitors, RF inductors, and shunt capacitors for blocking RF. The driver chip 802 may be implemented using the die layout 200 (described above in connection with FIG. 5) and packaging design described above in connection with FIGS. 6 and 7.

The circuit 800 generally implements a generic single-pole, double-throw (SPDT) RF switching application. For example, series and shunt diode pairs may be used for each arm of the switch. The diode pairs may be switched by the circuit 802 to conduct from a common RF port (e.g., RFC) through one of two RF paths (e.g., either RF1 or RF2) while shutting off the other RF path (e.g., RF2 or RF1, respectively), thereby placing the second RF path in isolation mode.

In one example, an external inverter 804 may be connected between control inputs (e.g., C1 and C2) of the driver chip 802. However, a control circuit may be implemented in place of the external inverter 804 to allow both arms to be switched off (e.g., a SPDT center-off type switch). The application of the driver chip 802 to power diodes in a switching application may be used at low frequencies where high power levels (e.g., on the order of 100 watts) are expected. A high reverse bias voltage is generally provided to ensure the RF voltage does not cause the series diode in isolation to conduct. Without sufficient D.C. reverse bias voltage to the appropriate series diode, RF energy may potentially leak through the isolation path and result in higher insertion loss on the path that is to be conducting in a low loss state.

Figure 9:
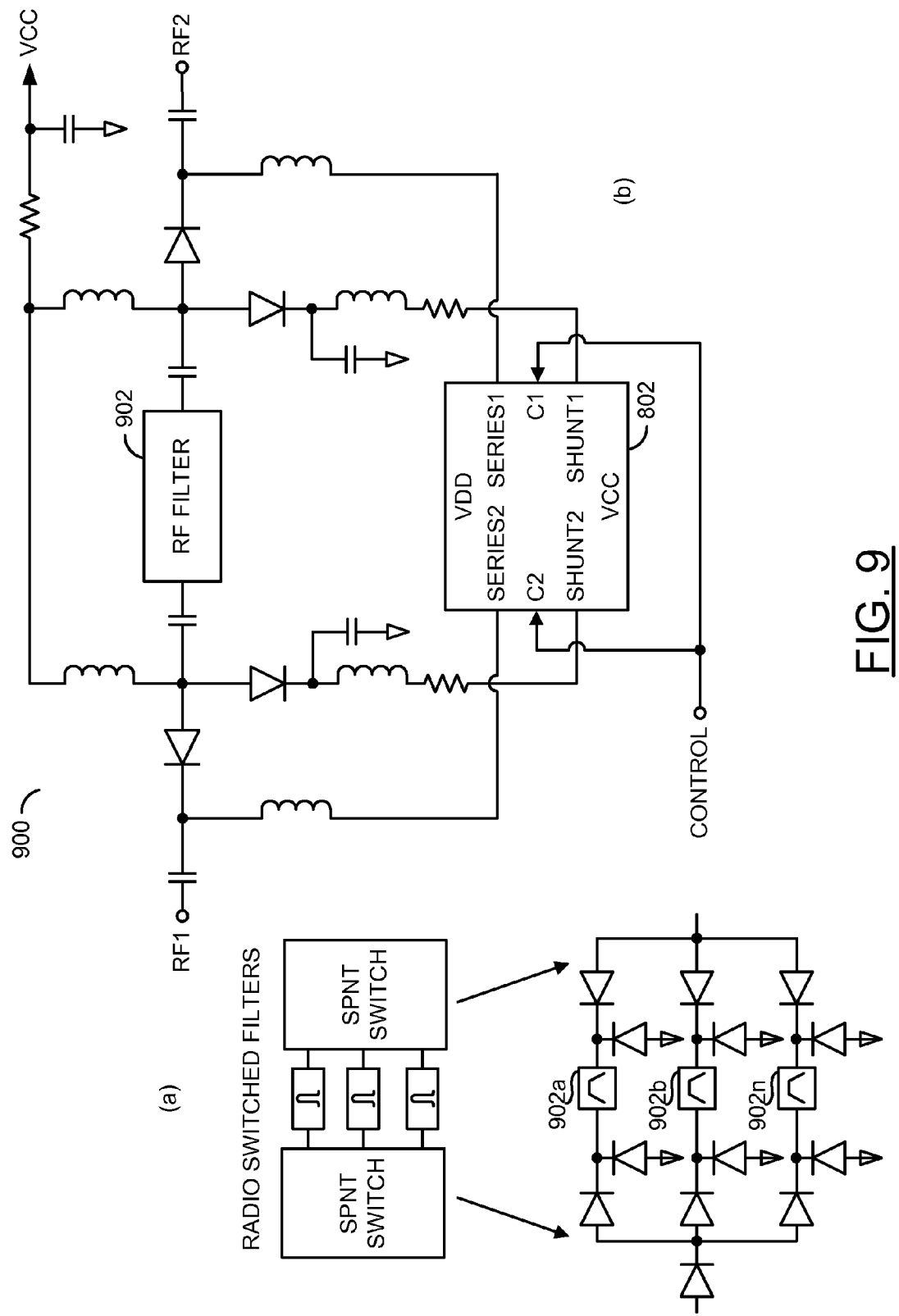
FIG. 9 is a diagram illustrating another example application of an ASIC PIN diode driver circuit in accordance with the present invention.

Referring to FIG. 9, a diagram of (a) a diode topology for a single-pole, N-throw (SPNT) filter switch and (b) an arm 900 of the SPNT switch is shown illustrating another example application of the ASIC PIN diode driver 802 implemented in accordance with the present invention. In one example, multiple single-pole, single-throw (SPST) switches, implemented in accordance with an embodiment of the present invention, may be used to implement the SPNT switch. The individual arms of the SPNT switch may switch various filter banks in and out of the system. For example, the driver chip 802 may have the control inputs C1 and C2 connected together so that both SPST diode switches are either on or off. The series and shunt diode pairs are used to switch a filter 902 in and out of the RF path. Multiple arms may be implemented similarly to the arm 900.

Military communications and wireless land-mobile radios may transmit and receive signals at different frequencies in a given period of time. Moreover, these systems often times transmit at different frequencies over brief periods of time in an effort to prevent any type of signal intervention. This frequent switching of frequencies is known as frequency-hopping. Historically, diode based switches have been used to switch various filter structures in and out to achieve different frequencies of transmission. These diodes require high RF power handling as the transmit chain of a military system can be as high as 200 Watts in systems such as vehicle mounted radios. With these levels of power, the filter banks that are to be turned off (while others are being used) must use high power PIN diodes. The high power PIN diodes require high reverse bias to keep the diodes in isolation. Hence, a high voltage, high current ASIC PIN driver implemented in accordance with an embodiment of the present invention is ideal to be used in this architecture. Additionally, because these diodes and filter banks are placed in the transmitter chain, low loss is required to maximize the RF power levels being transmitted. Series PIN diodes achieve their lowest insertion loss when using high levels of forward D.C. bias current. Again, the high voltage, high current ASIC PIN driver in accordance with an embodiment of the present invention is ideal in this architecture. For example, a high voltage, high current ASIC PIN driver in accordance with an embodiment of the present invention may be configured to provide up to 200 mA of current.

In one embodiment, the present invention generally provides a new high voltage, high current PIN diode driver IC. The driver IC is fully integrated. No external power MOSFETs are needed to achieve the desired functionality. The PIN diode driver ASIC in accordance with an embodiment of the present invention may be configured, for example, to provide 200 mA of current to two independent series diodes and 50 mA of current to two independent shunt diodes. The PIN diode driver ASIC in accordance with an embodiment of the present invention may be configured to drive a typical series/shunt, series/shunt single-pole-double-throw (SPDT) PIN diode switch. The PIN diode driver ASIC in accordance with an embodiment of the present invention generally includes a fully integrated voltage translator that allows regular logic control. For example, the PIN diode driver ASIC in accordance with an embodiment of the present invention is generally compatible with both 3V and 5V logic. The PIN diode driver ASIC in accordance with an embodiment of the present invention also includes a new voltage translator biasing circuit that allows an ultra wide back bias voltage range (e.g., from 20 volts to 250 volts). The PIN diode driver ASIC in accordance with an embodiment of the present invention generally has super low quiescent power consumption (e.g., as low as 10 µA) for 250 volt operation. The PIN diode driver ASIC in accordance with an embodiment of the present invention generally provides fast switching speed (e.g., less than 8 µs).

While the invention has been particularly shown and described with reference to the preferred embodiments thereof, it will be understood by those skilled in the art that various changes in form and details may be made without departing from the scope of the invention.

The invention claimed is:

1. An integrated circuit comprising:
    a first circuit configured to generate a first pair of complementary input signals in response to a first control input signal;
    a second circuit configured to generate a first pair of complementary output signals and a second pair of complementary output signals in response to said first pair of complementary input signals, a first bias signal, and a second bias signal;
    a third circuit configured to (i) receive a supply voltage, a ground potential, and a bias input signal, and (ii) generate said first and said second bias signals in response to said supply voltage, said ground potential, and said bias input signal;
    a first complementary pair of transistors configured to drive a first series output of said integrated circuit in response to a true signal of said first pair of complementary output signals and a true signal of said second pair of complementary output signals; and
    a second complementary pair of transistors configured to drive a first shunt output of said integrated circuit in response to a complement signal of said first pair of complementary output signals and a complement signal of said second pair of complementary output signals.

2. The integrated circuit according to claim 1, further comprising:
    a fourth circuit configured to generate a second pair of complementary input signals in response to a second control input signal;
    a fifth circuit configured to generate a third pair of complementary output signals and a fourth pair of complementary output signals in response to said second pair of complementary input signals, said first bias signal, and said second bias signal;
    a third complementary pair of transistors configured to drive a second series output of said integrated circuit in response to a true signal of said third pair of complementary output signals and a complement signal of said fourth pair of complementary output signals; and
    a fourth complementary pair of transistors configured to drive a second shunt output of said integrated circuit in response to a complement signal of said third pair of complementary output signals and a complement signal of said fourth pair of complementary output signals.

3. The integrated circuit according to claim 2, wherein said first and fourth circuits comprise input buffer circuits, said second and fifth circuits comprise voltage translator circuits, and said third circuit comprises a bias network.

4. The integrated circuit according to claim 1, wherein said integrated circuit is a high current application specific integrated circuit (ASIC) PIN diode driver.

5. The integrated circuit according to claim 1, wherein said integrated circuit operates over a voltage range from 20V to 250V, inclusive.

6. The integrated circuit according to claim 1, wherein said third circuit comprises a bias network utilizing a plurality of Zener diodes as a voltage reference.

7. The integrated circuit according to claim 6, wherein:
said bias network is configured to generate (i) a first bias voltage from three Zener diodes and (ii) a second bias voltage from two Zener diodes and a bipolar junction transistor configured as a diode; and
said first and said second bias voltages are referenced to said supply voltage.

8. The integrated circuit according to claim 7, wherein said bias network comprises a pair of high voltage field effect transistors (FETs) configured to protect the Zener diodes and the bipolar junction transistor.

9. The integrated circuit according to claim 7, wherein said bias network further comprises current mirrors configured to bias the Zener diodes.

10. The integrated circuit according to claim 6, wherein a current consumption of said bias network is independent of said supply voltage and controlled by a current through an external resistor.

11. A method for driving high current PIN diodes comprising:
receiving a control signal at a control input of an application specific integrated circuit (ASIC) and a bias current at a bias input of said application specific integrated circuit;
generating a pair of complementary input signals within said ASIC in response to said control signal;
generating a first bias signal and a second bias signal within said ASIC in response to said bias current, a supply voltage, and a ground potential;
generating a first pair of complementary output signals and a second pair of complementary output signals within said ASIC in response to said pair of complementary input signals, said first bias signal, and said second bias signal;
controlling a first complementary pair of transistors within said ASIC in response to a true signal of said first pair of complementary output signals and a true signal of said second pair of complementary output signals, wherein said first complementary pair of transistors is configured to drive a first series output of said ASIC; and
controlling a second complementary pair of transistors within said ASIC in response to a complement signal of said first pair of complementary output signals and a complement signal of said second pair of complementary output signals, wherein said second complementary pair of transistors is configured to drive a first shunt output of said ASIC.

12. The method according to claim 11, wherein said application specific integrated circuit comprises a high current PIN diode driver.

13. The method according to claim 12, wherein said high current PIN diode driver operates over a voltage range from 20V to 250V, inclusive.

14. The method according to claim 11, wherein generating said first bias signal and said second bias signal utilizes a plurality of Zener diodes as a voltage reference.

15. The method according to claim 11, wherein generating said first bias signal and said second bias signal further comprises:
generating a first bias voltage from a first, a second and a third Zener diodes connected in series; and
generating a second bias voltage from a fourth Zener diode, a fifth Zener diode, and a diode connected PNP bipolar junction transistor, wherein said first and said second bias voltages are referenced to said supply voltage of said application specific integrated circuit.

16. The method according to claim 11, further comprising controlling a current consumption of a bias network of said application specific integrated circuit based upon said bias input, wherein said current consumption is independent of said supply voltage of said application specific integrated circuit.

17. The method according to claim 16, wherein said current consumption is controlled in response to an external resistor connected between said bias input and a second supply voltage of said application specific integrated circuit.

18. The method according to claim 11, further comprising:
receiving a second control signal at a second control input of said ASIC;
generating a second pair of complementary input signals within said ASIC in response to said second control signal;
generating a third pair of complementary output signals and a fourth pair of complementary output signals within said ASIC in response to said second pair of complementary input signals, said first bias signal, and said second bias signal;
controlling a third complementary pair of transistors within said ASIC in response to a true signal of said third pair of complementary output signals and a true signal of said fourth pair of complementary output signals, wherein said third complementary pair of transistors is configured to drive a second series output of said ASIC; and
controlling a fourth complementary pair of transistors within said ASIC in response to a complement signal of said third pair of complementary output signals and a complement signal of said fourth pair of complementary output signals, wherein said fourth complementary pair of transistors is configured to drive a second shunt output of said ASIC.

19. The integrated circuit according to claim 2, wherein said integrated circuit is part of an apparatus configured to perform a radio frequency switching operation and said apparatus further comprises a first PIN diode coupled to said first series output of said integrated circuit, a second PIN diode coupled to said first shunt output of said integrated circuit, a third PIN diode coupled to said second series output of said integrated circuit, and a fourth PIN diode coupled to said second shunt output of said integrated circuit.

20. An integrated circuit comprising:
a first circuit configured to generate a first input signal in response to a first control input signal;
a second circuit configured to generate a first output signal and a second output signal in response to said first input signal and a bias signal;
a third circuit configured to generate said bias signal in response to a bias input signal;

a first complementary pair of transistors configured to drive a first series output of said integrated circuit in response to said first output signal; and a second complementary pair of transistors configured to drive a first shunt output of said integrated circuit in response to said second output signal, wherein said integrated circuit is a high current application specific integrated circuit (ASIC) PIN diode driver and said third circuit comprises a bias network utilizing a plurality of Zener diodes as a voltage reference.

21. A method for driving high current PIN diodes comprising:

receiving a control signal at a control input of an application specific integrated circuit (ASIC) and a bias current at a bias input of said application specific integrated circuit;

generating an input signal within said ASIC in response to said control signal;

generating a bias signal within said ASIC in response to said bias current, wherein generating said bias signal further comprises generating a first bias voltage from a first, a second, and a third Zener diodes connected in series and generating a second bias voltage from a fourth Zener diode, a fifth Zener diode, and a diode connected PNP bipolar junction transistor, wherein said first and said second bias voltages are referenced to a supply voltage of said ASIC;

generating a first output signal and a second output signal within said ASIC in response to said input signal and said bias signal;

controlling a first complementary pair of transistors within said ASIC in response to said first output signal, wherein said first complementary pair of transistors is configured to drive a first series output of said ASIC; and controlling a second complementary pair of transistors within said ASIC in response to said second output signal, wherein said second complementary pair of transistors is configured to drive a first shunt output of said ASIC.

* * * * *